United States Patent [19]

Winter

[11] Patent Number: 4,473,857

[45] Date of Patent: Sep. 25, 1984

[54] INPUT PROTECTION CIRCUIT FOR ELECTRONIC INSTRUMENT

[75] Inventor: Robert A. Winter, Sioux Falls, S. Dak.

[73] Assignee: Sencore, Inc., S. Dak.

[21] Appl. No.: 387,158

[22] Filed: Jun. 10, 1982

[51] Int. Cl.³ ............................................. H02H 7/20
[52] U.S. Cl. .................................... 361/91; 361/1; 324/72.5; 324/149; 323/369; 333/81 A
[58] Field of Search ................ 361/1, 58, 91, 88, 111, 361/110; 324/149, 72.5, 110, 119, 158 P, 121, 131, 126, 128, 97; 333/81 A; 323/369, 370

[56] References Cited

U.S. PATENT DOCUMENTS 2,881,400  4/1959  Rogers .......................... 324/149 X
2,883,619  4/1959  Kobbe et al. .................. 324/149 X
3,532,982  10/1970  Zeidlhack et al. ............. 324/121 R Primary Examiner—Patrick R. Salce
Attorney, Agent, or Firm—Edmond T. Patnaude

[57] ABSTRACT

A protection circuit for an electronic AC/DC instrument employs an input resistor connected across the DC input terminals of the instrument in series with the inner terminal of a coaxial cable connected to a resistance input probe, the inner cable being connected to the AC input terminals by means of a capacitor.

2 Claims, 1 Drawing Figure

U.S. Patent  Sep. 25, 1984  4,473,857
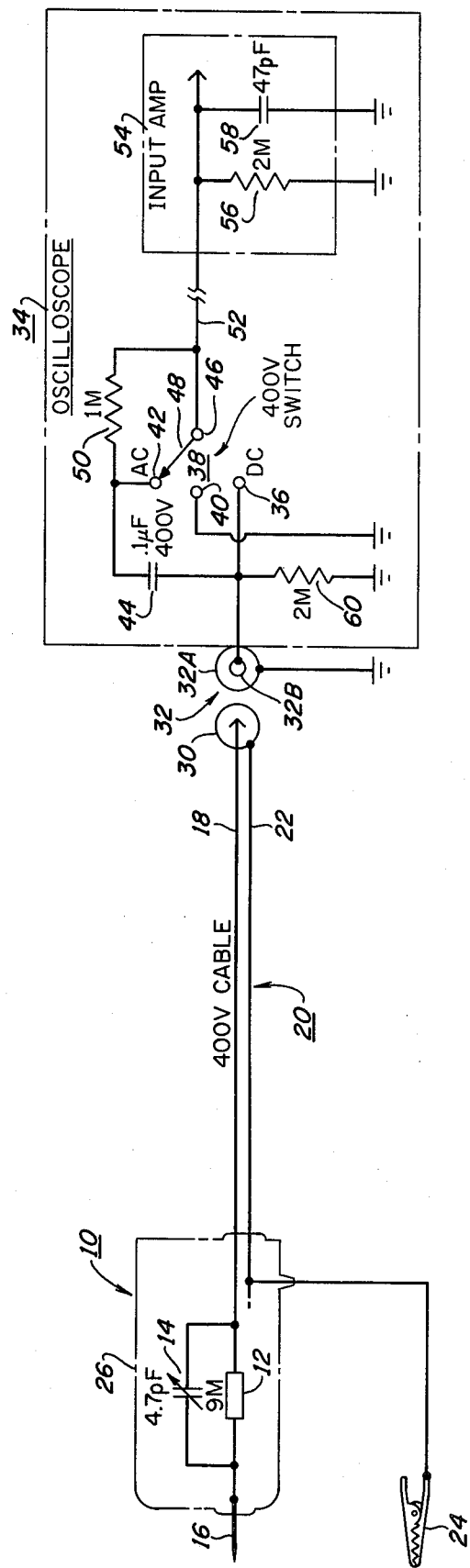

INPUT PROTECTION CIRCUIT FOR ELECTRONIC INSTRUMENT

The present invention relates in general to circuitry for protecting the signal input circuits of electronic instruments from overvoltage input signals, and it relates in particular to a protection circuit for a cathode ray tube oscilloscope or the like having a signal input probe and an input selector switch for switching between AC and DC operating modes.

BACKGROUND OF THE INVENTION

In the past the DC signal input voltage to an electronic measuring and monitoring instrument such as a cathode ray oscilloscope for use with both AC and DC input signals has been limited to the breakdown voltage of the input probe cable and/or the breakdown voltage of the AC/DC input selector switch. In such instruments a series connected capacitor couples the probe cable to the AC input terminal of the AC/DC selector switch, and if a DC signal is applied to the probe while the selector switch is in the AC position, the capacitor charges to the DC signal voltage and applies that voltage between the AC and DC input terminals of the switch. While the capacitor could be designed to have a high breakdown voltage, and a large, high voltage selector switch could be employed to withstand the higher DC input voltage, such a solution would not only be costly but would result in increased loading for high frequency input signals because of the increased stray capacitance inherent in bulky high voltage elements. Similarly, the probe cable could be made larger so as to withstand higher DC input voltages, but that would also be very costly.

SUMMARY OF THE INVENTION

Briefly, in accordance with the present invention an input resistance is connected between ground and the signal input terminal of the instrument to operate in combination with the internal resistance of the input probe as a voltage divider thereby reducing the voltage between the inner and outer terminals of the probe cable and reducing the voltage across the capacitor connected between the probe cable and the AC input terminal of the AC/DC selector switch. This novel protection circuit enables a substantial increase in the DC breakdown voltage while using standard parts and keeping stray capacitance to a minimum.

GENERAL DESCRIPTION OF THE DRAWING

The present invention will be better understood by a reading of the following detailed description taken in connection with the accompanying drawing wherein:

The single FIGURE is a schematic diagram of the input protection circuit of a cathode ray oscilloscope.

DETAILED DESCRIPTION OF A PREFERRED EMBODIMENT OF THE INVENTION

Referring to the drawing, a probe 10 includes a probe resistor 12 connected in parallel with a variable trimmer capacitor 14 between a signal input contact element 16 and one end of the inner conductor 18 of a conventional coaxial cable 20. The outer conductor 22 of the cable 20 constitutes a shield and is connected to an aligator clip 24 for connection to ground. As shown schematically, the probe 10 includes an insulating case 26 to facilitate the manual handling thereof.

A conventional plug 30 is provided at the other end of the cable 20 for connection to a socket 32 in the face of a cathode ray oscilloscope 34. The outer terminal 32A of the socket 32 is connected to the oscilloscope ground and constitutes one input terminal to the oscilloscope, the inner socket terminal 32B constituting the other input terminal.

The inner socket terminal 32B, which thus functions as an extension of the inner conductor 18 of the coaxial probe cable 20, is directly connected to the DC input contact 36 of an AC/DC selector switch 38. The switch 38 also has a neutral contact 40 which is connected to ground and an AC input contact 42 which is connected to the inner terminal 32B by means of a series connected capacitor 44. The switch 38 further includes an output terminal 46 and a wiper element 48 selectively movable into electric contact with the respective contacts 36, 40 and 42.

A resistor 50 is connected between the AC input contact 42 and the output terminal 46 which is connected by a lead 52 to the input amplifier 54 of the oscilloscope. As illustrated schematically, the amplifier 54 has an input impedance equal to that of the equivalent circuit represented by the resistor 56 and the capacitor 58 connected in parallel across the input terminals of the amplifier.

Preferably, the resistor 56 has a resistance value substantially equal to that of a resistor 60 connected between the inner socket element 32B and ground. The resistance value of the probe resistor 12 is chosen to be several times greater than that of the resistor 60 whereby the voltage applied to the AC switch contact 42 is several times less than the voltage of the probe contact 16. If the resistor 60 were not used, as in the prior art input circuits of cathode ray oscilloscopes, and a DC voltage were applied to the probe contact 16 while the switch wiper 48 were in the illustrated AC position, the switch 38 and the capacitor 44 would have to withstand that entire voltage rather than a fraction of it as is the case where the resistor 60 is used. Moreover, because of the voltage divider action of the resistors 12 and 60, the voltage between the inner and outer conductors of the cable 20 is also a fraction of the voltage between the probe contact 16 and ground, thus enabling the use of a smaller more easily handled probe cable.

In a commercial application of the present invention utilizing a conventional probe having a series resistance value of 9 megohms, using resistance values of 2 megohms for the resistors 56 and 60 reduced the high voltage breakdown limits of the cable 20, the capacitor 44 and the selector switch 38 from 2000 volts to 400 volts while improving the high frequency response of the oscilloscope.

Considering a typical use of the oscilloscope 34, the aligator clip 24 is attached to a grounded location on an instrument under test and the selector switch 38 is positioned in either the AC input position, as shown, or in the DC input position depending on whether the user intends to observe an AC or DC signal. With the switch 38 in the DC position a fraction of the voltage at the probe contact 16 will appear across the parallel connection of the resistors 56 and 60 and be applied across the input of the input amplifier of the oscilloscope. With the switch 38 in the AC position the voltage across the capacitor 44 will start at zero when the capacitor is uncharged and will increase toward the DC voltage across the resistor 60 if the probe contact 16 is in contact with a part of the instrument under test having a DC voltage.

In the drawing, the resistance and capacitance values of a successful reduction to practice of the input protection circuit described herein are shown. It will be understood, however, that the invention is not limited to the use of these particular circuit parameters.

While the present invention has been described in connection with a particular embodiment thereof, it will be understood by those skilled in the art that many changes and modifications may be made without departing from the true spirit and scope of the present invention. Therefore, it is intended by the appended claims to cover all such changes and modifications which come within the true spirit and scope of this invention.

What is claimed:

1. A protection circuit for protecting the input circuit of an AC/DC electronic instrument against an overvoltage, comprising
    a selector switch having a DC input terminal, an AC input terminal and an output terminal selectively connectable to one or the other of said input terminals,
    said output terminal being connected to one of a pair of the signal input terminals of said instrument,
    an input probe including a series connected probe resistor,
    a coaxial cable having an inner conductor and an outer conductor,
    one end of said inner conductor being connected to said probe resistor and the other end being connected to said DC input terminal,
    a capacitor connected between said other end of said inner conductor and said AC input terminal, and
    an input resistor connected between said other end of said inner conductor and the other of said signal input terminals said input resistor has a resistance value substantially the same as the input resistance of said instrument.

2. A protection circuit according to claim 1 wherein said outer conductor and the other one of said signal input terminals are grounded.

* * * * *